… … … … … … … … … … US005781129A

United States Patent [19]
Schwartz et al.

[11] Patent Number: 5,781,129
[45] Date of Patent: Jul. 14, 1998

[54] ADAPTIVE ENCODER CIRCUIT FOR MULTIPLE DATA CHANNELS AND METHOD OF ENCODING

[75] Inventors: Daniel B. Schwartz, Apache Junction; Ray D. Sundstrom, Chandler, both of Ariz.

[73] Assignee: Motorola, Inc., Schaumburg, Ill.

[21] Appl. No.: 811,062

[22] Filed: Mar. 3, 1997

[51] Int. Cl.$^6$ .................................................. H03M 7/00
[52] U.S. Cl. ............................................................ 341/51
[58] Field of Search ................................ 341/59, 50, 58, 341/119, 133, 135, 136

[56] References Cited

U.S. PATENT DOCUMENTS 5,196,849 3/1993 Galbraith ................................ 341/59

Primary Examiner—Brian K. Young
Attorney, Agent, or Firm—Rennie William Dover

[57] ABSTRACT

An adaptive encoder (10) provides a fixed upper limit on the number of consecutively transmitted data bits at a particular data bit location of a data word having a common logic value. A coder circuit (44) provides prioritization for a storage comparator register (102) to determine when data in a data channel (32) should be complemented. An invert circuit (58) complements the data in the data channel (32) when an upper limit of consecutive transmitted data bits have common logic values.

19 Claims, 2 Drawing Sheets

ADAPTIVE ENCODER CIRCUIT FOR MULTIPLE DATA CHANNELS AND METHOD OF ENCODING

BACKGROUND OF THE INVENTION

The present invention relates, in general, to integrated circuits and, more particularly, to encoding data in an integrated circuit.

Data transmission on either electrical or optical data links requires distinguishing between a logic one and a logic zero data value for received data. Electrical data links can suffer from long interconnect paths that cause attenuation in signal amplitudes and offset voltages. Optical data links can suffer from emission losses that cause digital signals to resemble analog signals. To allow for the correction of signal attenuation and dispersion, transmitted data ideally has equal numbers of logic one and logic zero data bits, thereby allowing the receiver to determine a midpoint value of the received data. Thus, the receiver accounts for signal attenuation by comparing the received data with the midpoint value. A received data bit with a value greater than the midpoint value is assigned a logic one value and a received data bit with a value less than the midpoint value is assigned a logic zero value.

Several encoding schemes have been used in an effort to equalize the number of logic one and logic zero data bits being transmitted. Data has been encoded to create transitions in the data stream and thereby avoid long spans of repeated null signals. One such encoding scheme involves a mapping of successive data bits into symbols. Symbols are patterned to have some adjacent data bits with complementary logic values to insure data transitions. However, symbol mapping requires a higher bandwidth, a data latency for data decoding, and symbol start and stop bit detection.

Another encoding scheme attempts to insure transitions in the transmitted data stream by using Manchester encoding. Manchester encoding modifies the transmitted data by exclusive-Oring the data bits with a full speed clock signal. However, Manchester encoding schemes are sensitive to clock-to-data skewing and require twice the bandwidth in transmitting the encoded data.

A single channel of transmitted data using either mapped symbols or pseudo-random encoding can improve the error rate of received data to a value limited by the low frequency cutoff of the receiver. However, this error rate floor is not acceptable for some applications.

Accordingly, it would be advantageous to provide an improved method and circuit of encoding data that has a low error rate for received data. It would be of further advantage to provide a method for data transmission having a minimal penalty in bandwidth, no data latency, and no complex hardware for implementing the encoding scheme. Furthermore, the method should be expandable to block sizes of arbitrary length and accommodate multiple data channels rather than a single data channel.

DETAILED DESCRIPTION OF THE DRAWINGS

Generally, the present invention provides an upper limit on the number of consecutive data bits having a common logic state that can be encoded by an adaptive encoder circuit and transmitted over either an electrical or an optical data link. By fixing an upper limit, data at the receiver is forced closer to having equal numbers of logic one and logic zero data bits, thereby limiting the low frequency content of the data stream to improve the data error rate.

Figure 1:
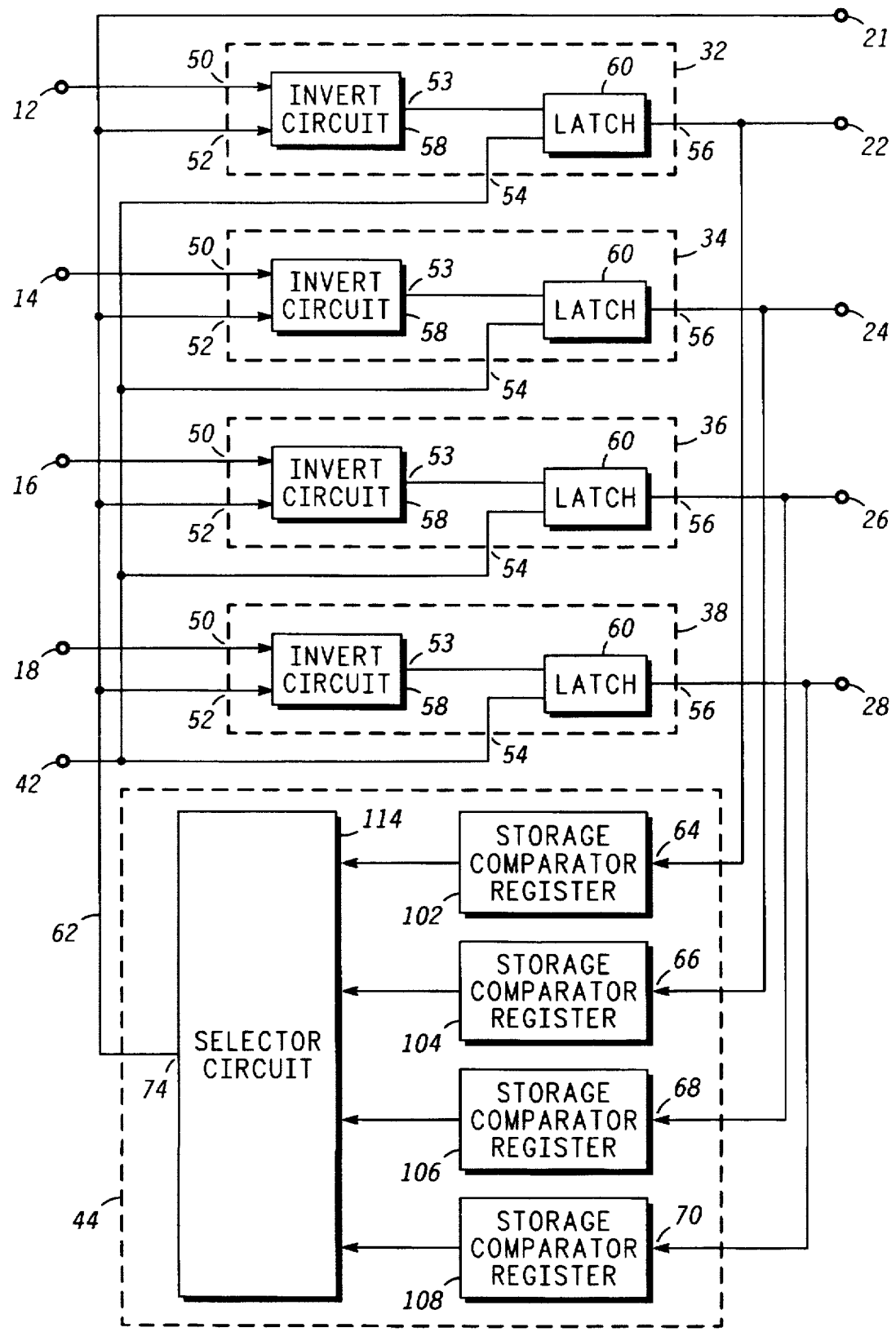
FIG. 1 is a block diagram of an adaptive encoder for encoding parallel data in accordance with the present invention.

FIG. 1 is a block diagram of an adaptive encoder circuit 10 for encoding parallel data in accordance with the present invention. Adaptive encoder circuit 10 has input terminals 12, 14, 16, and 18 coupled for receiving data signals and an input terminal 42 coupled for receiving a clock signal. Adaptive encoder circuit 10 has output terminals 22, 24, 26, and 28. In addition, a data transition signal is supplied from output terminal 21. The data transition signal and the data signals that are output from output terminals 22–28 are typically transmitted to a receiver circuit (not shown). It should be noted that a clock signal may or may not be combined with the data transition signal that is supplied from output terminal 21. The combined signal contains both timing and clock cycle information that identifies when data from terminals 22–28 is complemented and transmitted. In addition, adaptive encoder circuit 10 includes data channels 32, 34, 36, and 38, and a coder circuit 44.

It should be noted that signals from the output terminals of adaptive encoder circuit 10 could be transmitted to the input terminals of the receiver circuit as infrared optical signals. Alternatively, the output terminals could be physically linked to the input terminals of the receiver circuit through either fiber optic or wire conductors. The type of connections used to link the transmitter with the receiver are not a limitation of the present invention.

Preferably, each data channel such as, for example, data channels 32, 34, 36, and 38 have inputs 50, 52, and 54, and an output 56. In particular, input 50 of data channels 32–38 is connected to respective input terminals 12, 14, 16, and 18 of adaptive encoder circuit 10. Inputs 52 of data channels 32–38 are commonly connected to line 62. Inputs 54 of data channels 32–38 are commonly connected to input terminal 42 of adaptive encoder circuit 10. Outputs 56 of data channels 32–38 are connected to respective output terminals 22, 24, 26, and 28 of adaptive encoder circuit 10.

Each data channel 32–38 includes an invert circuit 58 and a latch circuit 60. Invert circuit 58 has one input that serves as input 50 and another input that serves as input 52 of data channels 32–38. The data received at input 50 is supplied to output 53 when input 52 has a logic zero value, but the complement of the data is supplied to output 53 when input 52 has a logic one value. Output 53 of invert circuit 58 is connected to a data input of latch circuit 60. A clock input of latch circuit 60 serves as input 54 of data channels 32–38. An output of latch circuit 60 serves as output 56 of data channels 32–38.

A coder circuit 44 has inputs 64, 66, 68, and 70, and an output 74. In particular, inputs 64, 66, 68, and 70 are connected to output 56 of respective data channels 32–38. Output 74 is connected to line 62. In particular, coder circuit 44 has storage comparator registers 102, 104, 106, and 108, and a selector circuit 114. Data transition storage comparator registers 102–108 each have an input that serves as inputs 64–70, respectively, of coder circuit 44 and each storage comparator register 102–108 has an output.

Preferably, adaptive encoder circuit 10 would have the same number N, where N is an integer number of input terminals, data channels, data channel output terminals, and storage comparator registers. By way of example, N has a value of four. This is not a limitation of the present invention as other embodiments could have a different value for N.

Selector circuit 114 has an input connected to the output of storage comparator register 102, an input connected to the output of storage comparator register 104, an input connected to the output of storage comparator register 106, and an input connected to the output of storage comparator register 108. Although the outputs of storage comparator registers 64, 66, 68, and 70, are shown as single connectors to selector circuit 114, this is not a limitation of the present invention. By way of example, the outputs of storage comparator registers 64, 66, 68, and 70 could be bus connections. The output of selector circuit 114 serves as output 74 of coder circuit 44.

In operation, adaptive encoder circuit 10 transmits all of the bits of a data word during one clock cycle and M data words in M clock cycles, where M is an integer representing the number of data words that are collectively stored in comparator registers 102-108. Individually, storage comparator registers 102-108 each record a history of M logic values for the particular bit locations of transmitted data words. For an N bit data word, the most significant bit (bit N-1) is a data signal appearing at output terminal 22 and the least significant bit (bit 0) is a data signal appearing at output terminal 28. Storage comparator register 102 has storage cells that store the logic values of M consecutively transmitted data bits from output terminal 22. The data bit of the next most significant bit, i.e., bit N-2, of the N bit data word appears at output terminal 24. Storage comparator register 104 stores the logic values of M consecutively transmitted data bits from output terminal 24. The data bit of the next most significant bit, i.e., bit N-3, of the N bit data word appears at output terminal 26. Storage comparator register 106 stores the logic values of M consecutively transmitted data bits from output terminal 26. The data bit of the least significant bit of the N bit data word appears at output terminal 28. Storage comparator register 108 stores the logic values of M consecutively transmitted data bits from output terminal 28. It should be noted that storage comparator registers 102-108 store the logic values of the data signals at terminals 22-28, respectively, once the data becomes stable.

Complementary logic values stored in storage comparator registers 102-108 indicate that data transitions have occurred. For example, assume storage comparator register 102 has stored logic values for the most significant bits of M transmitted data words. When the logic values stored in storage comparator register 102 are ones and zeros, data transitions have occurred in the most significant bit location of M transmitted data words. When the logic values stored in storage comparator register 102 are either all ones or all zeros, data transitions have not occurred in the most significant bit location, i.e., bit position N-1, of the M transmitted data words.

The method of storing the logic values for particular bit locations of the transmitted data words in storage comparator registers 102-108 is not a limitation of the present invention. Methods for storing the logic values include shift registers, data latches, a memory, a first-in-first-out (FIFO) register, a state-machine, or the like. By way of example, a shift register having M stages could be used to store logic values for the most significant bit location of the transmitted data words. An M-input NOR gate and an M-input NAND gate having inputs connected to the outputs of each shift register stage can detect all logic zero values and all logic one values, respectively. Someone skilled in the art can provide storage comparator registers 102-108 having outputs that indicate whether logic transitions have or have not occurred.

Alternatively, a counter could be used for storage comparator register 102. Although a counter does not store the logic values being transmitted from output terminal 22, a counter can be used to count the M bits. For instance, any two consecutively transmitted data bits at output terminal 22 that have complementary logic values could be used to reset the counter. The counter only counts when adjacent logic values were the same. Thus, a string of either all one or all zero logic values allows a modulo-M counter to count. The output of storage comparator register 102 provides a signal that indicates M consecutive bits have been transmitted without a logic transition.

Selector circuit 114 assigns priorities to storage comparator registers 102-108 that cause data channels 32-38 to provide complemented data. For instance, selector circuit 114 assigns a priority to storage comparator register 102 for M clock cycles. During the M clock cycles, M data words are transmitted using data from output terminals 22-28. Storage comparator register 102 stores the most significant data bits of the M data words. The data in data channels 32-38 is complemented when a logic one value is supplied to the output of storage comparator register 102. Only storage comparator register 102 can cause output 74 of selector circuit 114 to have a logic one value. When the output of storage comparator register 102 is not a logic one value, output 74 has a logic zero value and data in data channels 32-38 are left uncomplemented.

Selector circuit 114 then assigns a priority to storage comparator register 104 for M clock cycles. During the M clock cycles, M data words are transmitted using data from output terminals 22-28, which is stored by storage comparator register 104. The data in data channels 32-38 is complemented when a logic one value is supplied to the output of storage comparator register 104. Only storage comparator register 104 can cause output 74 of selector circuit 114 to have a logic one value. When the output of storage comparator register 104 is not a logic one value, output 74 has a logic zero value and data in data channels 32-38 is left uncomplemented.

Thus, selector circuit 114 gives priority to storage comparator registers 102-108 for M clock cycles in a sequential manner. Storage comparator register 102 follows storage comparator register 108 in receiving prioritization. It should also be noted that those skilled in the art are aware of techniques for sequentially providing prioritization to storage comparator registers 102-108. For instance, a shift register having a logic one in a field of logic zeros and shifted once every M clock cycles could provide both the sequential selection and the required repetition in providing prioritization to storage comparator registers 102-108.

Figure 2:
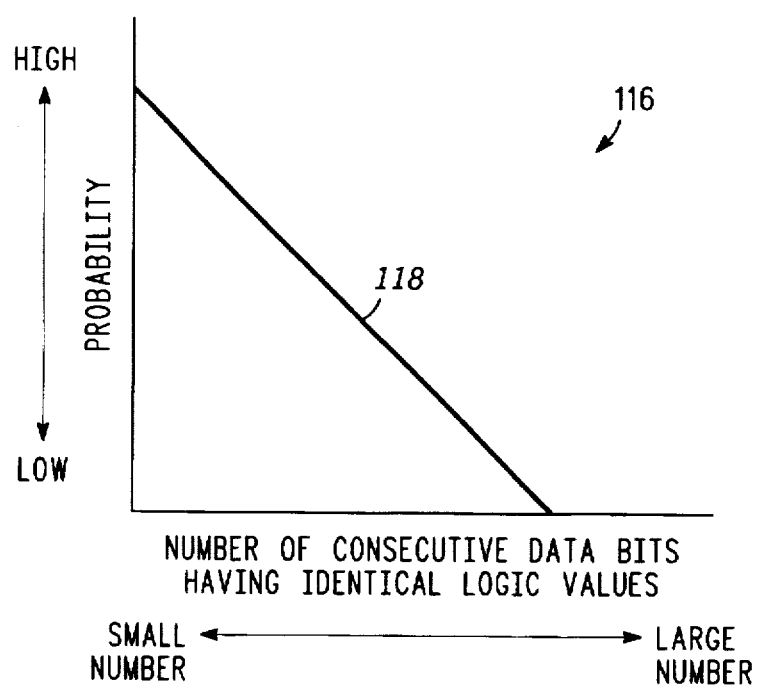
FIG. 2 is a plot of probability of occurrence versus number of consecutive data bits having like logic values for a random data stream.

FIG. 2 is a plot 116 of probability of occurrence versus number of consecutive data bits having like logic values for a random data stream. The vertical axis is a logarithmic scale showing the probability of M consecutive data bits having the same logic value and is labeled PROBABILITY. The horizontal axis is the number M of consecutive data bits having identical logic values. Curve 118 shows that the probability is high for transmitting a small number of consecutive data bits having identical logic values. Curve 118 also shows that there is a small probability for transmitting a large number of consecutive data bits having identical logic values.

Figure 3:
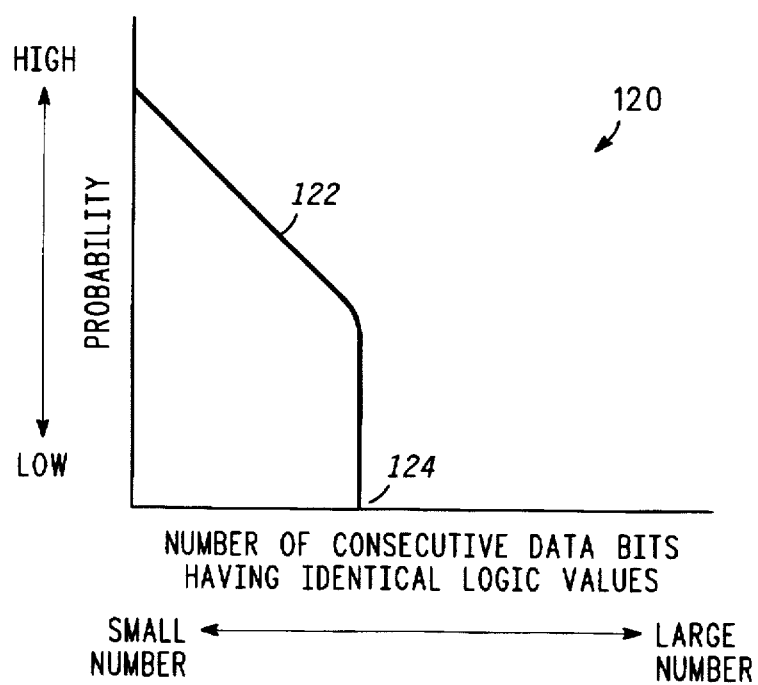
FIG. 3 is a plot of probability of occurrence versus number of consecutive data bits having like logic values for an adaptive encoder in accordance with the present invention.

FIG. 3 is a plot 120 of probability of occurrence versus number of consecutive data bits having like logic values for adaptive encoder circuit 10 in accordance with the present invention. The vertical axis is a logarithmic scale showing the probability of M consecutive data bits having the same logic value and is labeled PROBABILITY. The horizontal axis is the number of consecutive data bits M having identical logic values. Curve 122 shows that the probability is high for transmitting a small number of consecutive data bits having identical logic values. Curve 122 also shows that the probability is zero for transmitting a number of consecutive data bits having identical logic values when that number is greater than the value at boundary 124. Boundary 124 is a hard limit that is the maximum number of consecutive data bits having identical logic values.

The present invention has a value for boundary 124 (FIG. 3) that is set as the product of M and N. By way of example, N and M have a value of four. For this example, the probability is zero for transmitting seventeen or more consecutive logic zero or logic one values for any bit location of a data word. In other words, adaptive encoder circuit 10 operates to limit the data at each of output terminals 22-28 from exceeding a limit of sixteen consecutive logic zero or logic one values. It should be noted that the bandwidth of the code channel signal transmitted to the receiver circuit (not shown) from output terminal 21 has an upper value of (1/M) times the frequency of the data being transmitted from output terminals 22-28. By providing a boundary or hard limit of transmitting twenty or less consecutive data bits having identical logic values, the error rate can be improved.

By now it should be appreciated that the present invention provides a fixed upper limit on the number of consecutive data bits having a common logic value that can be transmitted for any bit location of the data word. The adaptive encoder provides an improved method of encoding data by causing data transitions on each data channel to minimize the error rate for received data. The method accommodates multiple data channels and minimizes the overhead to one code channel that has a low bandwidth that could be combined with the transmitted clock.

We claim:

1. An adaptive encoder circuit for multiple data channels, comprising:
    a first invert circuit having a first input, a second input, and an output, the first input coupled for receiving a first data bit;
    a second invert circuit having a first input, a second input, and an output, the first input coupled for receiving a second data bit;
    a first storage comparator register having an input and an output, wherein the input of the first storage comparator register is coupled to the output of the first invert circuit;
    a second storage comparator register having an input and an output, wherein the input of the second storage comparator register is coupled to the output of the second invert circuit; and
    a selector circuit having a first input, a second input, and an output, wherein the first input of the selector circuit is coupled to the output of the first storage comparator register, the second input of the selector circuit is coupled to the output of the second storage comparator register, and the output of the selector circuit is coupled to the second input of the first invert circuit and to the second input of the second invert circuit.

2. The adaptive encoder circuit of claim 1, wherein the output of the selector circuit is coupled to an output terminal and receives a signal that indicates channel data have been complemented.

3. The adaptive encoder circuit of claim 1, wherein the first invert circuit further comprises a latch having a data input, a clock input, and an output, wherein the data input is coupled to the output of the first invert circuit and the output of the latch is coupled to the input of the first storage comparator register.

4. The adaptive encoder circuit of claim 3, wherein the output of the latch is coupled to an output terminal of the adaptive encoder circuit.

5. A method of adaptive encoding, comprising the steps of:
    providing a plurality of storage comparator registers, each storage comparator register having at least M storage cells;
    selecting a first storage comparator register of the plurality of storage comparator registers for M clock cycles;
    storing a first set of data bits in the first storage comparator register, the first set of data bits being data from a first bit location of a data word; and
    complementing the data bits of a first complemented data word when the first set of data bits stored in the first storage comparator register have a same logic value.

6. The method of claim 5, further comprising the steps of:
    selecting a second storage comparator register of the plurality of storage comparator registers for M clock cycles;
    storing a second set of data bits in the second storage comparator register, the second set of data bits being data from a second bit location of the data word; and
    complementing data bits of a second complemented data word when the second set of data bits stored in the second storage comparator register have a same logic value.

7. The method of claim 6, wherein the second complemented data word is one data word more than a product of M and a total number of storage comparator registers.

8. The method of claim 6, further including the step of limiting a number of consecutive data bits having a same logic value for a bit location of the data word to less than or equal to a product of M and a total number of storage comparator registers.

9. The method of claim 6, wherein the step of selecting the second storage comparator register includes sequentially selecting the second storage comparator register as the last in a total number of storage comparator registers.

10. The method of claim 5, wherein the first complemented data word includes complementing the data bits of an M+1 data word.

11. The method of claim 5, wherein the step of complementing the data bits includes complementing the data bits for one clock cycle of M clock cycles.

12. The method of claim 5, further including the step of providing a data transition signal that indicates the data bits have been complemented.

13. A method of encoding, comprising the steps of:
    selecting a storage location for M clock cycles, the storage location having storage cells, where M is a number of storage cells at the storage location;
    storing a first set of M data bits in the storage cells at the storage location for a least significant bit of M consecutive data words; and
    complementing data bits of a first data word when the first set of M data bits in the storage cells have a same logic value.

14. The method of claim 13. wherein complementing the data bits includes complementing the data bits of the first data word one clock cycle in M clock cycles when the storage cells have a same logic value.

15. The method of claim 14. further comprising the steps of:

storing a second set of M data bits in the storage cells for a most significant bit location of M consecutive data words; and complementing the data bits of a second data word when the storage cells have a same logic value.

16. The method of claim 15 wherein the step of complementing the data bits of a second data word includes limiting a maximum number of consecutive data bits at a bit location to a product of M and the number of data bits of the second data word.

17. The method of claim 15 further comprising the step of providing a data transition signal for indicating that the data bits of the second data word have been complemented.

18. The method of claim 15 wherein the step of storing the second set of M data bits includes using a counter to store the second set of M data bits.

19. The method of claim 15 wherein the step of storing the second set of M data bits includes using a shift register to store the second set of M data bits.

* * * * *